(12) United States Patent
Xia

(10) Patent No.: US 11,500,233 B2
(45) Date of Patent: Nov. 15, 2022

(54) OUTER BACK PLATE, BACK PLATE ASSEMBLY AND DISPLAY DEVICE

(71) Applicants: K-TRONICS (SUZHOU) TECHNOLOGY CO., LTD., Jiangsu (CN); BOE TECHNOLOGY GROUP CO., LTD., Beijing (CN)

(72) Inventor: Xiaoli Xia, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 232 days.

(21) Appl. No.: 16/909,615

(22) Filed: Jun. 23, 2020

(65) Prior Publication Data
US 2021/0026184 A1    Jan. 28, 2021

(30) Foreign Application Priority Data

Jul. 23, 2019    (CN) .......................... 201910670290.3

(51) Int. Cl.
*G02F 1/1333*    (2006.01)
*H05K 5/02*    (2006.01)

(52) U.S. Cl.
CPC ..... *G02F 1/133308* (2013.01); *H05K 5/0226* (2013.01); *H05K 5/0234* (2013.01); *G02F 1/133314* (2021.01)

(58) Field of Classification Search
CPC ......... G02F 1/133314; G02F 1/133308; G02F 1/133328; F16M 11/10; F16M 2200/08; H05K 5/0226; H05K 5/0234
See application file for complete search history.

(56) References Cited

U.S. PATENT DOCUMENTS

| | | | | |
|---|---|---|---|---|
| 5,553,820 A | * | 9/1996 | Karten .................. | F16M 11/10 248/181.2 |
| 7,922,133 B2 | * | 4/2011 | Hsu ........................ | F16M 13/00 248/133 |

(Continued)

FOREIGN PATENT DOCUMENTS

| CN | 102734763 A | 10/2012 |
|---|---|---|
| CN | 102982736 A | 3/2013 |

(Continued)

OTHER PUBLICATIONS

First Chinese Office Action dated Jul. 13, 2021, received for corresponding Chinese Application No. 201910670290.3, 14 pages.

*Primary Examiner* — James Wu
(74) *Attorney, Agent, or Firm* — Kinney & Lange, P.A.

(57) ABSTRACT

An outer back plate, a back assembly and a display device are provided. The outer back plate includes: a first supporting surface and a second supporting surface on a first side of the outer back plate; a back surface on a second side of the outer back plate; and a first connecting portion on the first side, wherein the first connecting portion includes a first protruding portion protruding in a direction away from the back surface of the outer back plate with respect to the first supporting surface and the second supporting surface to form a first protruding surface, and an orthographic projection of the first protruding surface in a direction perpendicular to the back surface of the outer back plate is located between an orthographic projection of the first supporting surface in the direction and an orthographic projection of the second supporting surface in the direction.

16 Claims, 16 Drawing Sheets

(56) References Cited

U.S. PATENT DOCUMENTS

| | | |
|---|---|---|
| 8,896,996 B2 | 11/2014 | Sakamoto |
| 9,739,933 B2 | 8/2017 | Kim et al. |
| 10,061,076 B2 | 8/2018 | Yu |
| 10,274,769 B2 | 4/2019 | Kil et al. |
| 10,845,633 B2 | 11/2020 | Koda |
| 2011/0292317 A1 | 12/2011 | Kim et al. |
| 2013/0003283 A1 | 1/2013 | Sakamoto |
| 2014/0104502 A1* | 4/2014 | Takao .................. F16M 11/22 361/679.01 |
| 2014/0347881 A1 | 11/2014 | Kim et al. |
| 2017/0322365 A1 | 11/2017 | Yu |
| 2018/0017827 A1 | 1/2018 | Kil et al. |
| 2019/0212606 A1 | 7/2019 | Koda |

FOREIGN PATENT DOCUMENTS

| | | |
|---|---|---|
| CN | 103576378 A | 2/2014 |
| CN | 203718526 U | 7/2014 |
| CN | 105511159 A | 4/2016 |
| CN | 206209230 U | 5/2017 |
| CN | 107621711 A | 1/2018 |
| CN | 109283723 A | 1/2019 |
| CN | 109791321 A | 5/2019 |
| JP | 2009237246 A | 10/2009 |
| JP | 2011249331 A | 12/2011 |
| JP | 2013238639 A | 11/2013 |
| JP | 2013247073 A | 12/2013 |

\* cited by examiner

OUTER BACK PLATE, BACK PLATE ASSEMBLY AND DISPLAY DEVICE

CROSS-REFERENCE TO RELATED APPLICATION

The present application claims the benefit of Chinese Patent Application No. 201910670290.3 filed on Jul. 23, 2019 in the National Intellectual Property Administration of China, the whole disclosure of which is incorporated herein by reference.

TECHNICAL FIELD

The present disclosure relates to a field of display technology, and in particular, to an outer back plate, a back plate assembly and a display device.

BACKGROUND

LCD (liquid crystal display) technology generally realizes display operation by utilizing cooperation of an LCD panel and a backlight module. At present, a LCD device generally includes a display panel, a backlight module, a front frame, a middle frame, a back frame and the like. The display panel and the backlight module are positioned and fixed together by the front frame, the middle frame and the back frame and the like.

As consumers' demands for various display devices including liquid crystal display devices have been increased, display devices having features of ultra-small thickness, narrow frame, and beautiful appearance have become popular. Therefore, designing structures for positioning and fixing the display panel and the backlight module to realize the display device with characteristics of ultra-small thickness, narrow frame and beautiful appearance and the like gradually becomes a research subject of research personnel.

SUMMARY

Embodiments of the present disclosure provide an outer back plate, a back plate assembly and a display device.

According to one aspect, an outer back plate for a display device is provided, the outer back plate including:

a first supporting surface on a first side of the outer back plate;

a second supporting surface on the first side of the outer back plate;

a back surface on a second side of the outer back plate, the second side being opposite to the first side; and a first connecting portion on the first side of the outer back plate, wherein the first connecting portion includes a first protruding portion protruding in a direction away from the back surface of the outer back plate with respect to the first supporting surface and the second supporting surface to form a first protruding surface, and an orthographic projection of the first protruding surface in a direction perpendicular to the back surface of the outer back plate is located between an orthographic projection of the first supporting surface in the direction perpendicular to the back surface of the outer back plate and an orthographic projection of the second supporting surface in the direction perpendicular to the back surface of the outer back plate.

In some embodiments, the outer back plate further includes a second connecting portion, wherein the second connecting portion is on a second side of the outer back plate and includes a second protruding portion, an orthographic projection of the second protruding portion in the direction perpendicular to the back surface of the outer back plate at least partially overlaps an orthographic projection of the first protruding portion in the direction perpendicular to the back surface of the outer back plate.

In some embodiments, the outer back plate further includes a receiving groove, wherein the receiving groove includes:

a first groove side surface;

a second groove side surface parallel to the first groove side surface; and a groove bottom surface connecting the first groove side surface and the second groove side surface, wherein first groove side surface is coplanar with the second supporting surface, and the second groove side surface has a connecting end connected to the groove bottom surface and a free end distal to the groove bottom surface.

In some embodiments, the first connecting portion further includes a connecting hole in the first protruding portion, and the second connecting portion further includes a shaft hole in the second protruding portion, and the connecting hole is in communication with the shaft hole In some embodiments, the connecting hole has a first hole portion and a second hole portion, the first hole portion is closer to the first protruding surface than the second hole portion, the first hole portion communicates with the second hole portion, and an diameter of the first hole portion is equal to or larger than an diameter of the second hole portion.

In some embodiments, the outer back plate further includes:

a first transition surface connecting the first supporting surface and the first protruding surface, wherein the first transition surface is perpendicular to the first supporting surface and the first protruding surface; and/or a second transition surface connecting the second supporting surface and the first protruding surface, wherein the second transition surface is perpendicular to the second supporting surface and the first protruding surface.

In some embodiments, the second supporting surface is closer to the back surface in the direction perpendicular to the back surface of the outer back plate than the first supporting surface.

Embodiments of the disclosure also provide a back plate assembly for a display device, including:

the outer back plate as described above;

a first back plate, an orthographic projection of the first back plate in the direction perpendicular to the back surface of the outer back plate at least partially overlapping with an orthographic projection of the first supporting surface in the direction perpendicular to the back surface of the outer back plate; and a second back plate, an orthographic projection of the second back plate in the direction perpendicular to the back surface of the outer back plate at least partially overlapping with an orthographic projection of the second supporting surface in the direction perpendicular to the back surface of the outer back plate.

In some embodiments, an orthographic projection of the second back plate in the direction perpendicular to the back surface of the outer back plate at least partially overlaps with an orthographic projection of the first protruding surface in the direction perpendicular to the back surface of the outer back plate.

In some embodiments, the outer back plate further includes a receiving groove for receiving a part of the second back plate.

In some embodiments, the first back plate has a first back plate back surface facing the back surface of the outer back plate, the first back plate back surface and the first supporting surface face each other, and a first glue portion is disposed between the first back plate back surface and the first supporting surface.

In some embodiments, the first back plate has a first back plate side surface facing the first protruding portion, and the outer back plate further includes a first transition surface connecting the first supporting surface and the first protruding surface, and the first transition surface supports the first back plate side surface.

In some embodiments, the second back plate has a second back plate back surface facing the back surface of the outer back plate, the second back plate back surface and the first protruding surface face each other, and a gap is formed between the second back plate back surface and the first protruding surface.

In some embodiments, a size of the first back plate in the direction perpendicular to the back surface of the outer back plate is greater than a size of the second back plate in the direction perpendicular to the back surface of the outer back plate.

In some embodiments, the first back plate includes a glass back plate and the second back plate includes a metal back plate.

Embodiments of the present disclosure also provide a display device, including:

the back plate assembly as described above;

a shaft member;

a base; and a connecting member, wherein an end of the shaft member is connected with the outer back plate of the back plate assembly, and another end of the shaft member is connected with the base; the connecting member is used to connect the outer back plate of the back plate assembly and the shaft member.

In some embodiments, the shaft member includes:

a pivot shaft fitted and mounted on the base; and a connecting arm protruding toward the outer back plate from the pivot shaft, and the connecting arm including a connecting arm hole for receiving the connecting member.

In some embodiments, the outer back plate of the back plate assembly includes a second connecting portion which includes a second protruding portion and a shaft hole in the second protruding portion, the shaft hole receiving the connecting arm, wherein the first connecting portion further includes a connecting hole in the first protruding portion, the connecting hole communicates with the connecting arm hole and a central axis of the connecting hole coincides with a central axis of the connecting arm hole, such that the connecting member is suitable to be inserted into the connecting hole and the connecting arm hole which communicate with each other.

In some embodiments, the display device further includes a circuit board on a second back plate back surface of the second back plate facing a back surface of the outer back plate, wherein the outer back plate includes a second transition surface connecting the second supporting surface and the first protruding surface, and a side of the circuit board facing the first protruding portion is spaced apart from the second transition surface.

In some embodiments, the outer back plate further includes a receiving groove, the receiving groove including:

a first groove side surface;

a second groove side surface parallel to the first groove side surface; and a groove bottom surface connecting the first groove side surface and the second groove side surface, wherein the second groove side surface has a connecting end connected to the groove bottom surface and a free end distal to the groove bottom surface, and wherein a perpendicular distance between a side surface of the circuit board facing the first protrusion portion and the second transition surface is greater than a perpendicular distance between the groove bottom surface and the free end of the second groove side surface.

BRIEF DESCRIPTION OF THE DRAWINGS

Other objects and advantages of the present disclosure will become apparent from the following description of the present disclosure, which refers to the accompanying drawings, and can be helpful in a comprehensive understanding of the present disclosure.

Figure 1:
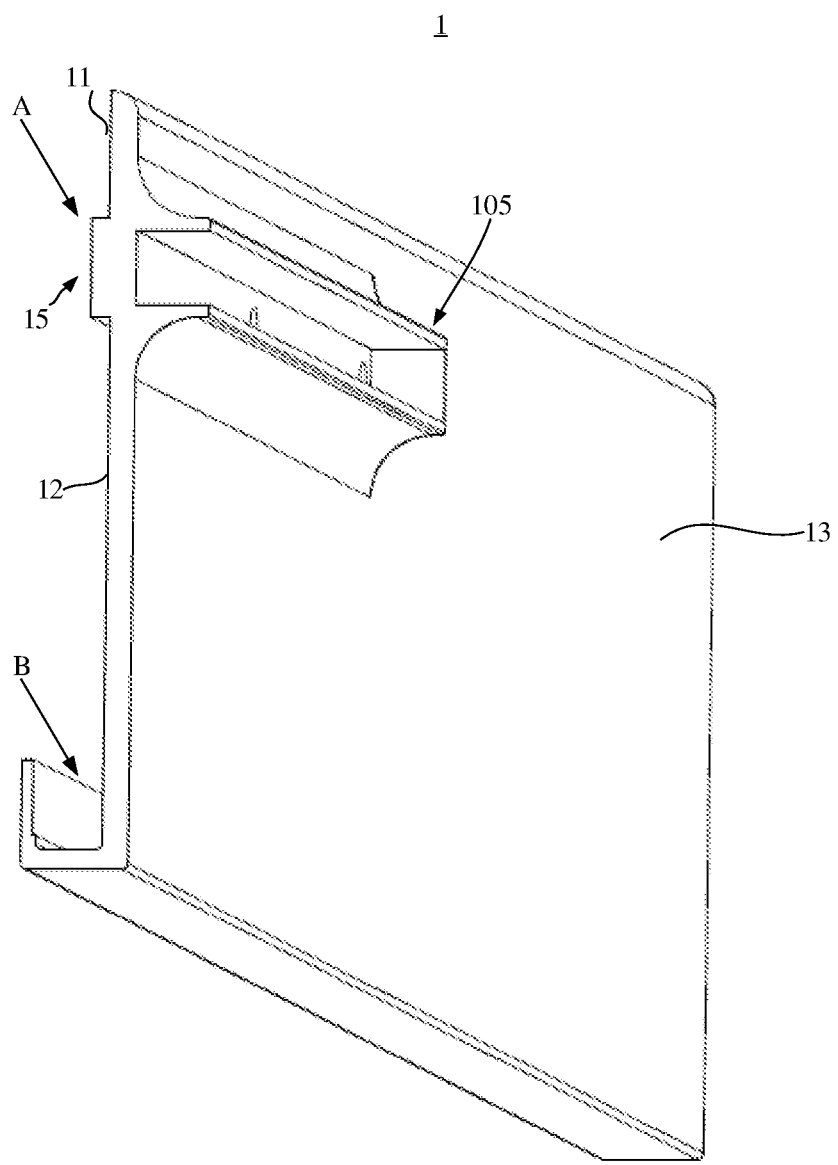
FIG. 1 is a perspective schematic view of an outer back plate for a display device according to an embodiment of the present disclosure.

It is noted that, for the sake of clarity, sizes of layers, structures or regions in the drawings used to describe embodiments of the present disclosure may be exaggerated or reduced in size, i.e., drawings are not drawn to actual scale.

DETAILED DESCRIPTION OF EMBODIMENTS

In order to make objects, technical solutions and advantages of embodiments of the present disclosure more apparent, the technical solutions of the embodiments of the present disclosure will be clearly and completely described below with reference to the drawings of the embodiments of the present disclosure. It is to be understood that the described embodiments are only part of the embodiments of the present disclosure, and not all embodiments. All other embodiments, which can be obtained by those skilled in the art from the described embodiments of the present disclosure without any inventive efforts, fall within the scope of protection of the present disclosure.

Unless defined otherwise, technical or scientific terms used in the present disclosure should be given as their ordinary meaning understood by those ordinary skilled in the art. The usage of "first", "second" and the like in the present disclosure is not intended to indicate any order, quantity, or importance, but rather is used to distinguish one element from another. The word "include" or "comprise" and the like, means that element or item preceding this diction includes element or item listed after this diction and its equivalent, but does not exclude other elements or items.

In this disclosure, unless otherwise specifically stated, directional terms such as "upper", "lower", "left", "right", "inner", "outer" and the like are used to indicate orientations or position relationships based on the orientation shown in the drawings, merely for convenience of describing the present disclosure, and do not indicate or imply that referenced devices, elements, or components must have a particular orientation, be constructed or operated in a particular orientation. It should be understood that when the absolute positions of the objects to be described are changed, the relative position relationships they represent may also change accordingly. Accordingly, these directional terms should not be construed as limiting the present disclosure.

In this disclosure, the expressions "display surface", "display side", "back surface" and "back side" are used to indicate the orientation of the respective components of the display device or to indicate the relative position relationship of the respective components of the display device. It should be understood that "display surface" and "display side" refer to a surface and a side of a display device and the respective components of the display device facing users, respectively, and "back surface" and "back side" refer to a surface and a side of a display device and the respective components of the display device facing away from users, respectively.

Figure 2:
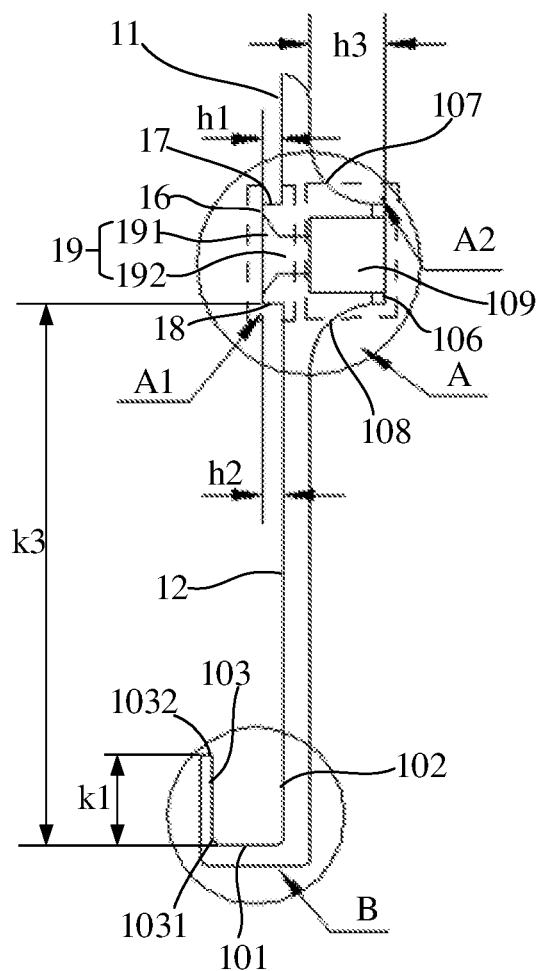
FIG. 2 is a front view of an outer back plate for a display device according to an embodiment of the present disclosure.

FIG. 1 is a perspective schematic view of an outer back plate for a display device according to an embodiment of the present disclosure. FIG. 2 is a front view of an outer back plate for a display device according to an embodiment of the present disclosure. With reference to FIG. 1 and FIG. 2, an outer back plate 1 for a display device according to an embodiment of the present disclosure may include a connecting portion A and a receiving portion B.

As shown in FIG. 2, the outer back plate 1 may include a first supporting surface 11, a second supporting surface 12 and a back surface 13, and the first supporting surface 11 and the second supporting surface 12 are located on the same side of the outer back plate 1, that is, on a side of the outer back plate 1 facing a display surface of the display device (the left side in FIG. 2). The back surface 13 is located on the side of the outer back plate 1 opposite to the first supporting surface 11 and the second supporting surface 12, that is, on a side of the outer back plate 1 facing away from the display surface of the display device (the right side in FIG. 2). Herein, the side of the outer back plate 1 facing the display surface of the display device (the left side in FIG. 2) is referred to as a first side of the outer back plate, and the side of the outer back plate 1 facing away from the display surface of the display device (the right side in FIG. 2) is referred to as a second side of the outer back plate.

As shown in FIG. 2, the second supporting surface 12 is closer to the back surface 13 than the first supporting surface 11, i.e., a perpendicular distance between the second supporting surface 12 and the back surface 13 is smaller than a perpendicular distance between the first supporting surface 11 and the back surface 13. For example, any two of the first supporting surface 12, the first supporting surface 11 and the back surface 13 are parallel to each other.

The connecting portion A includes a first connecting portion A1 and a second connecting portion A2. The first connecting portion A1 is located on a first side of the outer back plate 1, namely, on the side facing the display surface of the display device. The second connecting portion A2 is located on the second side of the outer back plate 1, namely, the side facing away from the display surface of the display device.

Specifically, the first connecting portion A1 includes a first protruding portion 15. The first protruding portion 15 protrudes in a direction away from the back surface 13 (i.e., toward the display surface of the display device) with respect to the first supporting surface 11 and the second supporting surface 12 to form a first protruding surface 16. The first protruding surface 16 is located between the first supporting surface 11 and the second supporting surface 12, and is closer to the display surface of the display device than the first supporting surface 11 and the second supporting surface 12. A first transition surface 17 is formed between the first supporting surface 11 and the first protruding surface 16, and a second transition surface 18 is formed between the second supporting surface 12 and the first protruding surface 16. In the embodiment shown in FIG. 2, the first protruding surface 16 is parallel to the first and second supporting surfaces 11, 12, and the first transition surface 17 is perpendicular to the first supporting surface 11 and the first protruding surface 16, thereby forming a right-angled transition portion, i.e., a right-angled step portion, between the first supporting surface 11 and the first protruding surface 16. The second transition surface 18 is perpendicular to the second supporting surface 12 and the first protruding surface 16, thereby forming a right-angled transition portion, i.e., a right-angled step portion, between the second supporting surface 12 and the first protruding surface 16.

In an embodiment of the present disclosure, the outer back plate 1 includes: the first supporting surface 11, which is located at the first side of the outer back plate, that is, the side facing the display surface of the display device; the second supporting surface 12, which is located at the first side of the outer back plate 1, i.e., the side facing the display surface of the display device; the back surface 13, which is located at the second side of the outer back plate 1, i.e., the side facing away from the display surface of the display device; and the first connecting portion A1 located at the first side of the outer back plate, i.e., the side facing the display surface of the display device, wherein the second supporting surface 12 is closer to the back surface than the first supporting surface in a direction perpendicular to the display surface of the display device (i.e., a direction perpendicular to the back surface of the outer back plate). The first connecting portion A1 includes a first protruding portion 15 protruding in a direction away from the back surface of the outer back plate with respect to the first supporting surface 11 and the second supporting surface 12 to form the first protruding surface 16. The first protruding surface 16 is located between the first supporting surface 11 and the second supporting surface 12. An orthographic projection of the first protruding surface 16 in a direction perpendicular to the back surface 13 of the outer back plate 1 is located between an orthographic projection of the first supporting surface 11 in a direction perpendicular to the back surface 13 of the outer back plate 1 and an orthographic projection of the second supporting surface 12 in a direction perpendicular to the back surface 13 of the outer back plate 1. Through such a structure, the protruding portion not only can support the back plate, but also can strengthen the mechanical strength of the connecting portion, and is beneficial to the structural stability of the display device.

The first connecting portion A1 also includes a connecting hole 19 formed in the first protruding portion 15 for receiving a connecting member such as a screw (to be described further below). More specifically, as shown in FIG. 2, the connecting hole 19 may include a first hole portion 191 which can be used to receive a head portion of the screw and a second hole portion 192 which can be used to receive a rod portion of the screw. The first hole portion 191 may have a larger hole diameter than the second hole portion 192. For example, the shape and size of the first hole portion 191 may match the shape and size of the head of the screw, and the shape and size of the second hole portion 192 may match the shape and size of the pole of the screw.

Specifically, the second connecting portion A2 includes a second protruding portion 105 which corresponds to the first protruding portion 15 in position, that is, an orthographic projection of the second protruding portion 105 in a direction perpendicular to the display surface of the display device (i.e., a direction perpendicular to the back surface of the outer back plate) at least partially overlaps with an orthographic projection of the first protruding portion 15 in a direction perpendicular to the display surface of the display device (i.e., a direction perpendicular to the back surface of the outer back plate). Herein "at least partially overlap" includes: the orthographic projection of the first protruding portion 15 in the direction perpendicular to the display surface of the display device falls within the orthographic projection of the second protruding portion 105 in the direction perpendicular to the display surface of the display device; the orthographic projection of the second protruding portion 105 in the direction perpendicular to the display surface of the display device falls within the orthographic projection of the first protruding portion 15 in the direction perpendicular to the display surface of the display device; and the orthographic projection of the second protruding portion 105 in the direction perpendicular to the display surface of the display device completely coincides with the orthographic projection of the first protruding portion 15 in the direction perpendicular to the display surface of the display device.

More specifically, the second protruding portion 105 protrudes away from the display surface of the display device from the back surface 13, i.e., in a direction toward the back surface 13 of the outer back plate 1, to form a second protruding surface 106. The second protruding surface 106 corresponds to the first protruding surface 16 in position, that is, the orthographic projection of the second protruding surface 106 in the direction perpendicular to the display surface of the display device (i.e., the direction perpendicular to the back surface of the outer back plate 1) at least partially overlaps with the orthographic projection of the first protruding surface 16 in the direction perpendicular to the display surface of the display device (i.e., the direction perpendicular to the back surface of the outer back plate). Herein "at least partially overlap" includes: the orthographic projection of the first protruding surface 16 in the direction perpendicular to the display surface of the display device falls within the orthographic projection of the second protruding surface 106 in the direction perpendicular to the display surface of the display device; the orthographic projection of the second protruding surface 106 in the direction perpendicular to the display surface of the display device falls within the orthographic projection of the first protruding surface 16 in the direction perpendicular to the display surface of the display device; and the orthographic projection of the first protruding surface 16 in the direction perpendicular to the display surface of the display device completely coincides with the orthographic projection of the second protruding surface 106 in the direction perpendicular to the display surface of the display device.

As shown in FIG. 2, the second protruding surface 106 is farther away from the display surface of the display device than the back surface 13. A third transition surface 107 is formed between the back surface 13 and the second protruding surface 106, and a fourth transition surface 108 is formed between the back surface 13 and the second protruding surface 106. In the embodiment shown in FIG. 2, the second protruding surface 106 is parallel to the back surface 13, and the third transition surface 107 and the fourth transition surface 108 are both arc surfaces, i.e., arc-shaped transition portions are respectively formed between the second protruding surface 106 and the back surfaces 13 on both sides thereof.

The second connecting portion A2 also includes a shaft hole 109 formed in the second protruding portion 105 for receiving a shaft structure (to be described further below). As shown in FIG. 2, the diameter of the shaft hole 109 may be larger than the diameter of the connecting hole 19, for example, larger than the diameter of the second hole portion 192. For example, the shape and size of the shaft hole 109 may match the shape and size of the shaft structure.

With reference to FIG. 2 again, the receiving portion B includes a receiving groove, which may be formed by bending a part of the outer back plate 1 toward the display surface of the display device, for example, and which may have a U-shape. The receiving groove may include a groove bottom surface 101, a first groove side surface 102 and a second groove side surface 103. The first groove side surface 102 and the second groove side surface 103 are located at two sides of the groove bottom surface 101, respectively, i.e., the first groove side surface 102 is located at a side of the groove bottom surface 101 facing away from the display surface of the display device, and the second groove side surface 103 is located at a side of the groove bottom surface 101 facing towards the display surface of the display device.

Optionally, the first groove side surface 102 and the second groove side surface 103 are parallel to each other, and the groove bottom surface 101 is perpendicular to the first groove side surface 102 and the second groove side surface 103.

In the embodiment shown in FIG. 2, the first groove side surface 102 is coplanar with the second supporting surface 12, i.e., the first groove side surface 102 and the second supporting surface 12 are the same surface, which may be uniformly referred to as second supporting surface 12. A size (i.e., a height in FIG. 2) k1 of the second groove surface 103 in a direction parallel to the display surface of the display device is smaller than a size (i.e., a height in FIG. 2) k3 of the second supporting surface 12 in a direction parallel to the display surface of the display device.

As shown in FIG. 2, the second groove side surface 103 may have a connection end 1031 connected to the groove bottom surface 101 and a free end 1032 away from the groove bottom surface 101.

In the embodiment shown in FIG. 2, the outer back plate 1 has an integral structure, i.e., the outer back plate 1 is manufactured by an integral molding process. For example, the outer back plate 1 may be made of plastic material, in which case it may be formed by an integral molding process such as injection molding. The outer back plate 1 may be made of metal material such as aluminum, stainless steel and the like, in which case it may be formed by an integral molding process such as die stamping.

Figure 3:
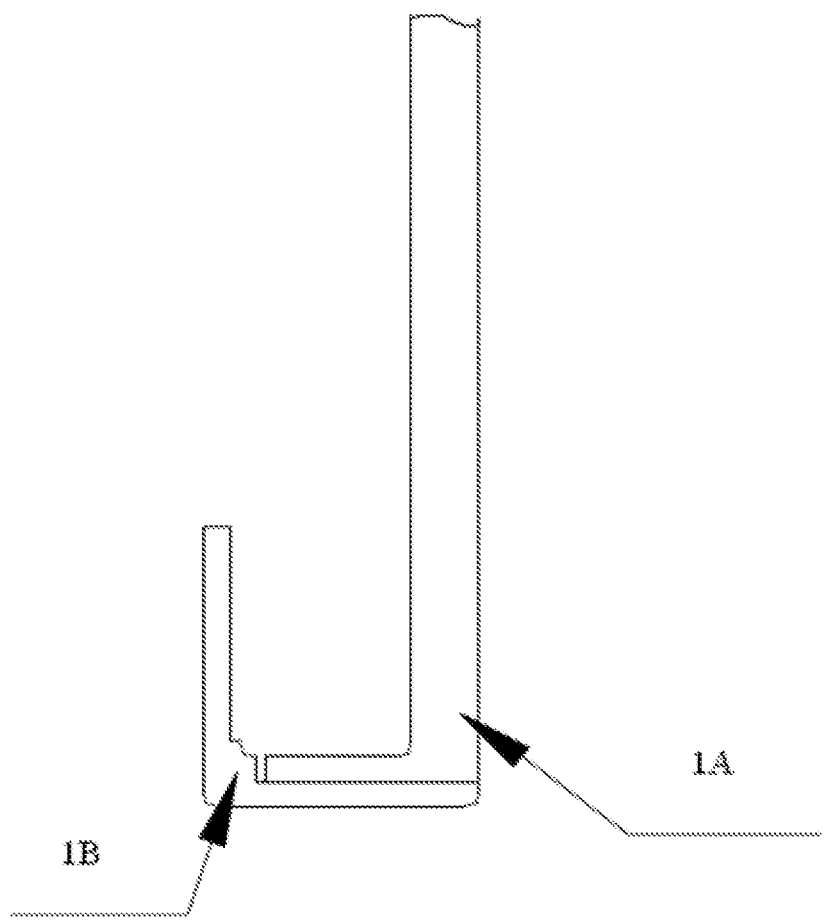
FIG. 3 is a partial schematic view of an outer back plate having a separated structure according to an embodiment of the present disclosure.

Alternatively, referring to FIG. 3, the outer back plate 1 may have a separated structure, for example, the outer back plate 1 may include a first outer back plate member 1A and a second outer back plate member 1B, which are both L-shaped members. The first outer back plate member 1A may include the connecting portion A and a part of the receiving portion B. The second outer back plate member 1B may include another part of the said receiving portion B. The first outer back plate member 1A and the second outer back plate member 1B are connected at the groove bottom surface 101 of the receiving portion B, for example, by means of elements such as screws, or by means of tape adhesion, to form the outer back plate 1.

In the embodiment of the disclosure, the outer back plate is not only used as a housing of the display device, but also used as a member for supporting a backlight module and the display panel of the display device and the like, which is beneficial to simplify the structure of the display device.

Figure 4:
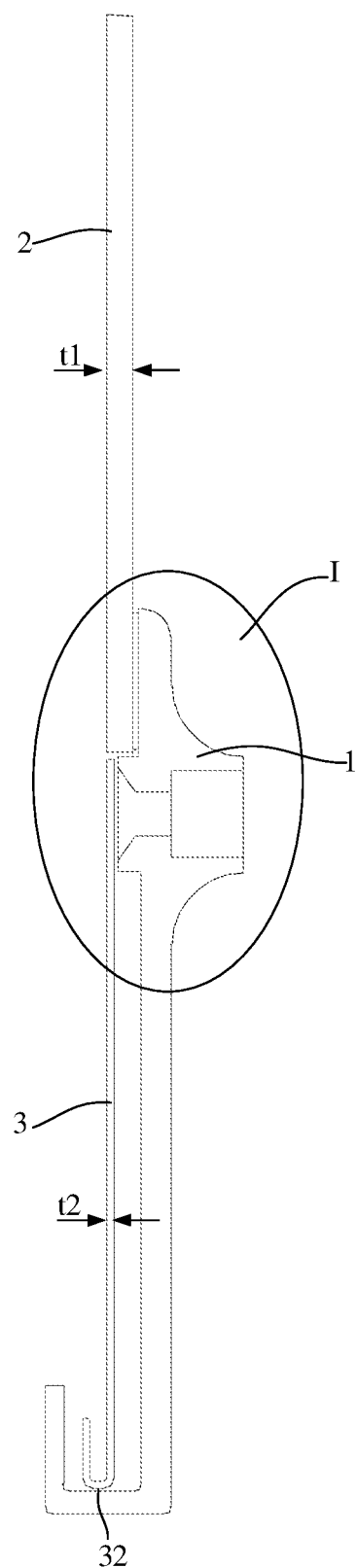
FIG. 4 is a schematic view of a back plate assembly for a display device according to an embodiment of the present disclosure.
Figure 5:
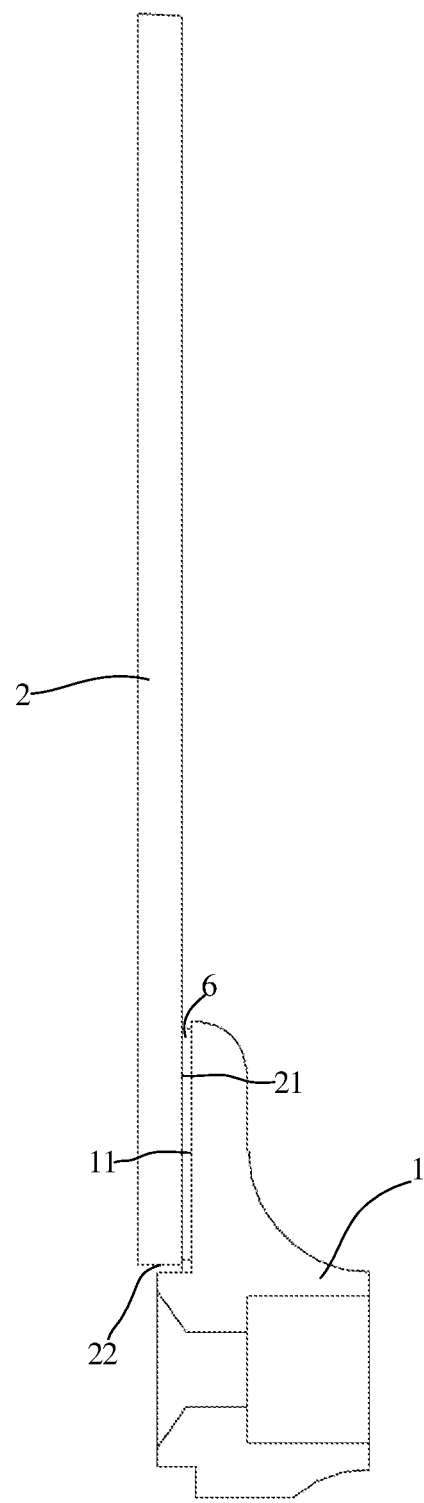
FIG. 5 is a partially enlarged view of the back plate assembly shown in FIG. 4.
Figure 6:
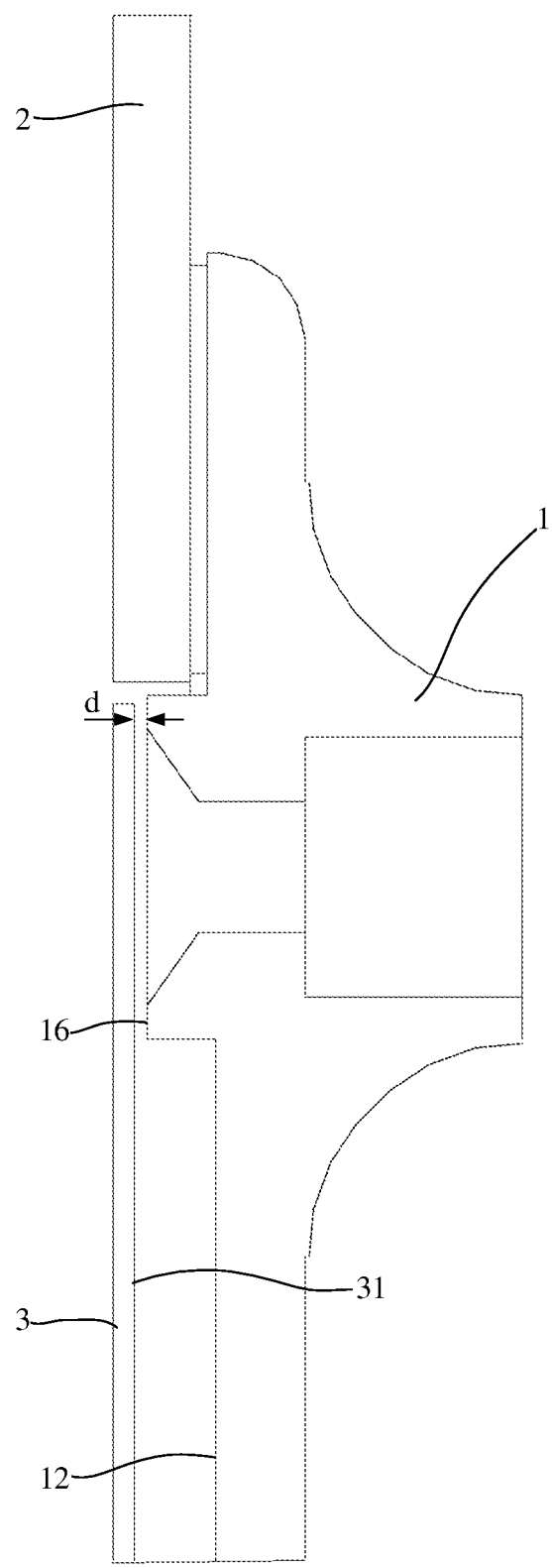
FIG. 6 is a partially enlarged view of portion I of the back plate assembly shown in FIG. 4.

FIG. 4 is a schematic view of a back plate assembly for a display device according to an embodiment of the present disclosure. FIG. 5 is a partially enlarged view of the back plate assembly shown in FIG. 4. FIG. 6 is a partially enlarged view of portion I of the back plate assembly shown in FIG. 4. Referring to FIGS. 4, 5 and 6, a back plate assembly for a display device according to an embodiment of the present disclosure may include an outer back plate 1, a first back plate 2 and a second back plate 3. The outer back plate 1 may be the outer back plate for the display device according to the various embodiments described above. The first back plate 2 may be a glass back plate and the second back plate 3 may be a metal back plate formed of material such as aluminum, stainless steel or the like.

In the embodiment of the disclosure, the glass back plate and the metal back plate are provided in combination. It may achieve the back plate assembly with attractive appearance to adapt the development trend of the display device while the structural stability is ensured.

A size (i.e., a thickness) t1 of the first back plate 2 in a direction perpendicular to the display surface of the display device may be greater than a size (i.e., a thickness) t2 of the second back plate 3 in a direction perpendicular to the display surface of the display device. Illustratively, the thickness of the first back plate 2 may be in a range of 1.8 to 2.2 mm, for example about 2 mm. The second back plate 3 may be made of aluminum, and may have a thickness in a range of 0.5 to 1.0 mm, for example, about 0.8 mm, or the second back plate 3 may be made of stainless steel, and may have a thickness of about 0.3 mm.

Referring to FIGS. 2, 4, 5 and 6, the first back plate 2 is supported by the first supporting surface 11. An orthographic projection of the first back plate 2 in a direction perpendicular to the display surface of the display device partially overlaps with an orthographic projection of the first supporting surface 11 in a direction perpendicular to the display surface of the display device. Specifically, the first back plate 2 has a first back plate back surface 21 facing away from the display surface of the display device. An orthographic projection of the first back plate back surface 21 in a direction perpendicular to the display surface of the display device partially overlaps with an orthographic projection of the first supporting surface 11 in a direction perpendicular to the display surface of the display device. The first back plate back surface 21 and the first supporting surface 11 face each other, and a first glue portion 6 is disposed between the first back plate back surface 21 and the first supporting surface 11 for connecting the first back plate 2 and the outer back plate 1. For example, the first glue portion 6 may include adhesive glue for bonding the first back plate 2 and the outer back plate 1.

The first back plate 2 also has a first back plate side surface 22 facing the first protruding portion 15. The first back plate side surface 22 and the first transition surface 17 face each other, and the first transition surface 17 supports the first back plate side surface 22, whereby the first back plate 2 can be supported by a right-angled step portion. Advantageously, regarding a large-sized display device, the first back plate 2 may be large in size, and the first back plate 2 has a huge weight accordingly. In this case, the adhesive force of the first adhesive portion 6 may not be enough to connect and fix the first back plate to the outer back plate. In other words, there is a risk that the first back plate moves downward. However, by providing the right-angled step portion to support the first back plate 2, the first back plate 2 is prevented from moving downward, and it is beneficial for the outer back plate 1 to support and fix the first back plate 2.

Refer to FIGS. 2, 4, 5 and 6 again, the second back plate 3 corresponds to the second supporting surface 12 and the first protruding surface 16 in position. Specifically, an orthogonal projection of the second back plate 3 in a direction perpendicular to the display surface of the display device partially overlaps an orthogonal projection of the second supporting surface 12 in a direction perpendicular to the display surface of the display device, and an orthogonal projection of the second back plate 3 in a direction perpendicular to the display surface of the display device partially overlaps an orthogonal projection of the first protruding surface 16 in a direction perpendicular to the display surface of the display device. Specifically, the second back plate 3 has a second back plate back surface 31 facing away from the display surface of the display device. An orthographic projection of the second back plate back surface 31 in a direction perpendicular to the display surface of the display device partially overlaps with an orthographic projection of the second supporting surface 12 in a direction perpendicular to the display surface of the display device, and an orthographic projection of the second back plate back surface 31 in a direction perpendicular to the display surface of the display device partially overlaps with an orthographic projection of the first protruding surface 16 in a direction perpendicular to the display surface of the display device. The second back plate back surface 31 and the second supporting surface 12 face each other, and the second back plate back surface 31 and the first protruding surface 16 face each other.

Referring to FIGS. 4 and 6, the first protruding portion 15 is disposed opposite to the second back plate 3. The second back plate 3 has smaller thickness than the first back plate 2, and the height of the first protruding portion 15 protruding toward the display surface of the display device is smaller than the thickness difference between the first back plate 2 and the second back plate 3. Through such a structural design, the first protruding portion is designed by utilizing the thickness difference between the two back plates, and the thickness of the back plate assembly will not be additionally increased due to the first protruding portion 15, so that the overall thickness of the display device cannot be increased, and the ultra-thin display device is favorably realized.

Referring to FIG. 6, the second back plate back surface 31 and the first protruding surface 16 face each other, and a gap d is formed between the second back plate back surface 31 and the first protruding surface 16. The value of the gap d is related to the machining tolerance of components such as the second back plate 3 and the first projecting portion 15 and the like, and the thermal expansion and contraction characteristics of the material thereof. For example, the value of the gap d may be larger than a sum of the machining tolerances of the second back plate 3 and the first protruding portion 15 and the maximum thermal expansion amount of the material thereof during the usage of the display device.

With combined reference to FIGS. 2, 4 and 6, a perpendicular distance between the first supporting surface 11 and the first protruding surface 16 (i.e., in a direction perpendicular to the display surface of the display device) is h1, a perpendicular distance between the second supporting surface 12 and the first protruding surface 16 (i.e., in a direction perpendicular to the display surface of the display device) is h2, and h1<h2. The values h1, h2 can be adjusted by designing a thickness t1 of the first back plate 2, a thickness t2 of the second back plate 3 and a projecting height of the first projection 15, so as to design a value of the gap d to avoid the interference between the second back plate 3 and the first projection 15. This is particularly advantageous for the installation of ultra-thin display panels.

Referring to FIG. 4, the second back plate 3 is received by the receiving portion B of the outer back plate 1, i.e., is accommodated in the receiving groove. For example, the second back plate 3 further has a second back plate side surface 32 facing the groove bottom surface 101, and the groove bottom surface 101 supports the second back plate side surface 32, whereby the receiving portion B can also support the second back plate 3.

Figure 7:
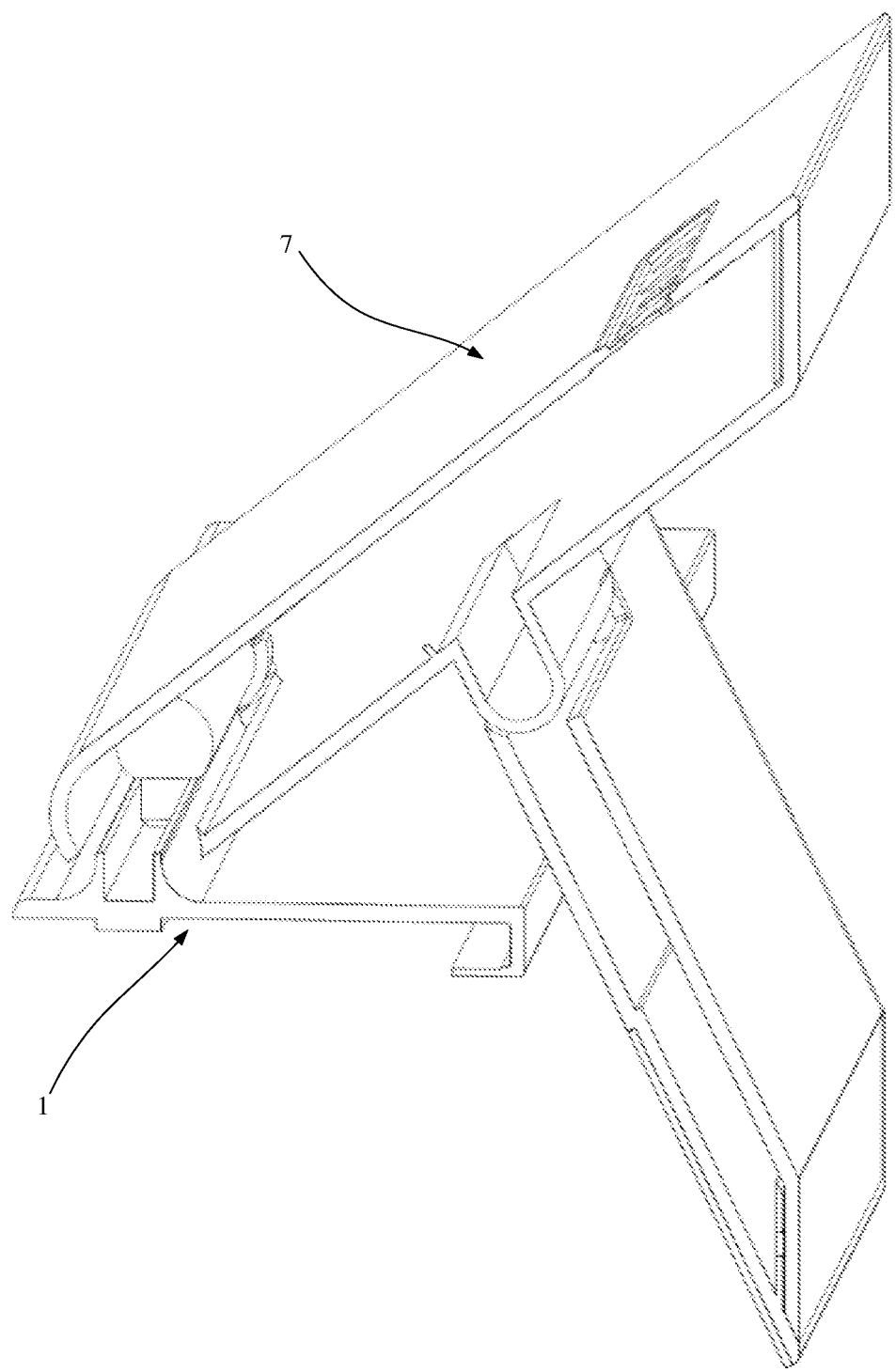
FIG. 7 is a perspective schematic view of a display device according to an embodiment of the present disclosure.
Figure 8:
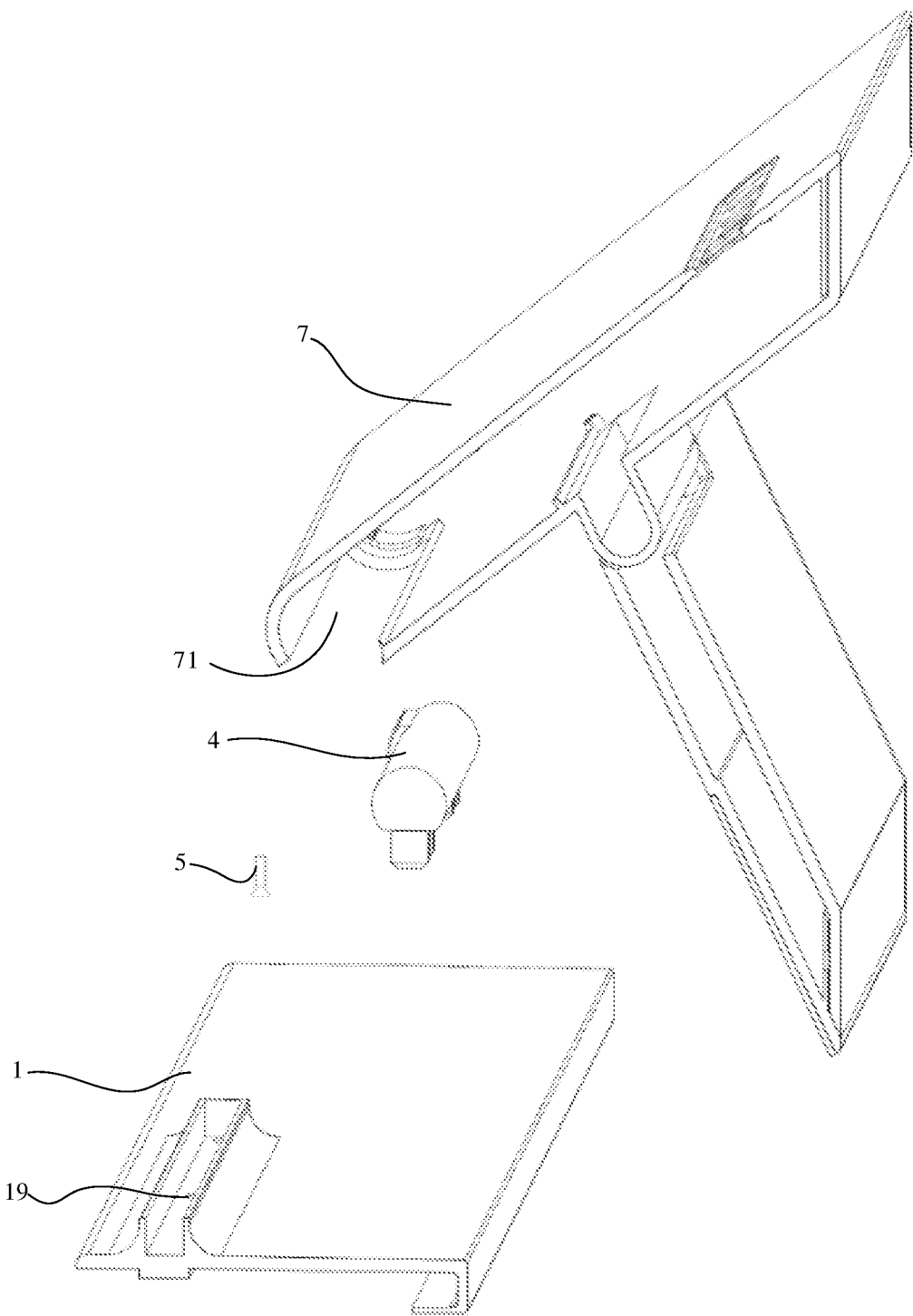
FIG. 8 is an exploded perspective view of a display device according to an embodiment of the present disclosure.
Figure 9:
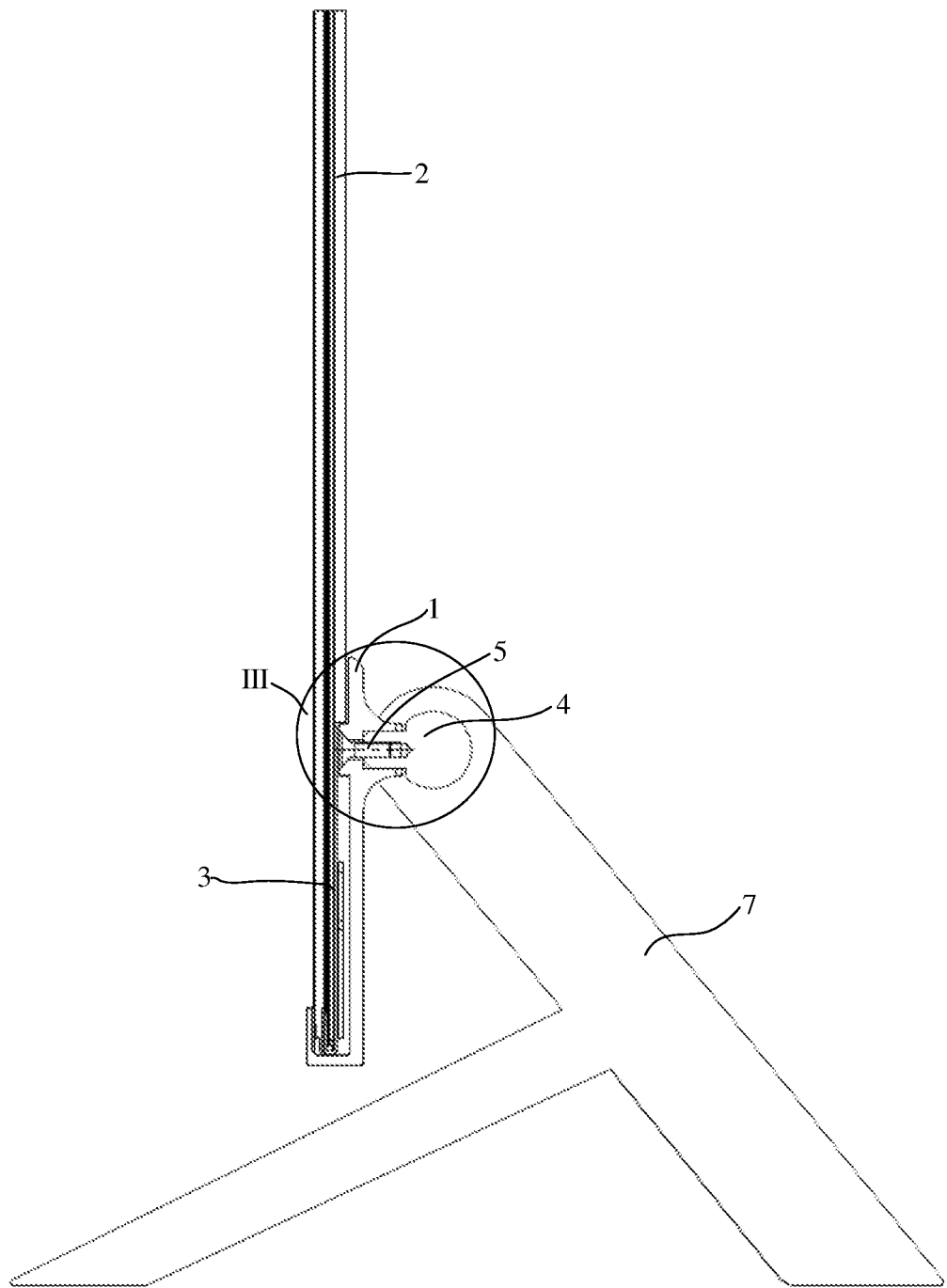
FIG. 9 is a front view of a display device according to an embodiment of the present disclosure.

FIG. 7 is a schematic perspective view of a display device according to an embodiment of the present disclosure. FIG. 8 is an exploded perspective view of a display device according to an embodiment of the present disclosure. In FIGS. 7 and 8, some elements of the display device (for example, the first back plate, the second back plate, the backlight module and the display panel and the like) are omitted to simplify the drawings. FIG. 9 is a front view of a display device according to an embodiment of the present disclosure. Referring to FIGS. 7-9, a display device according to an embodiment of the present disclosure may include the aforementioned back plate assembly, a shaft member 4, and a base 7. Specifically, the display device includes an outer back plate 1, a first back plate 2, a second back plate 3, a shaft member 4, a connecting member 5, and a base 7. The outer back plate 1, the first back plate 2 and the second back plate 3 may constitute the back plate assembly, and the structure of the back plate assembly can refer to the description of the aforementioned embodiments.

Figure 15:
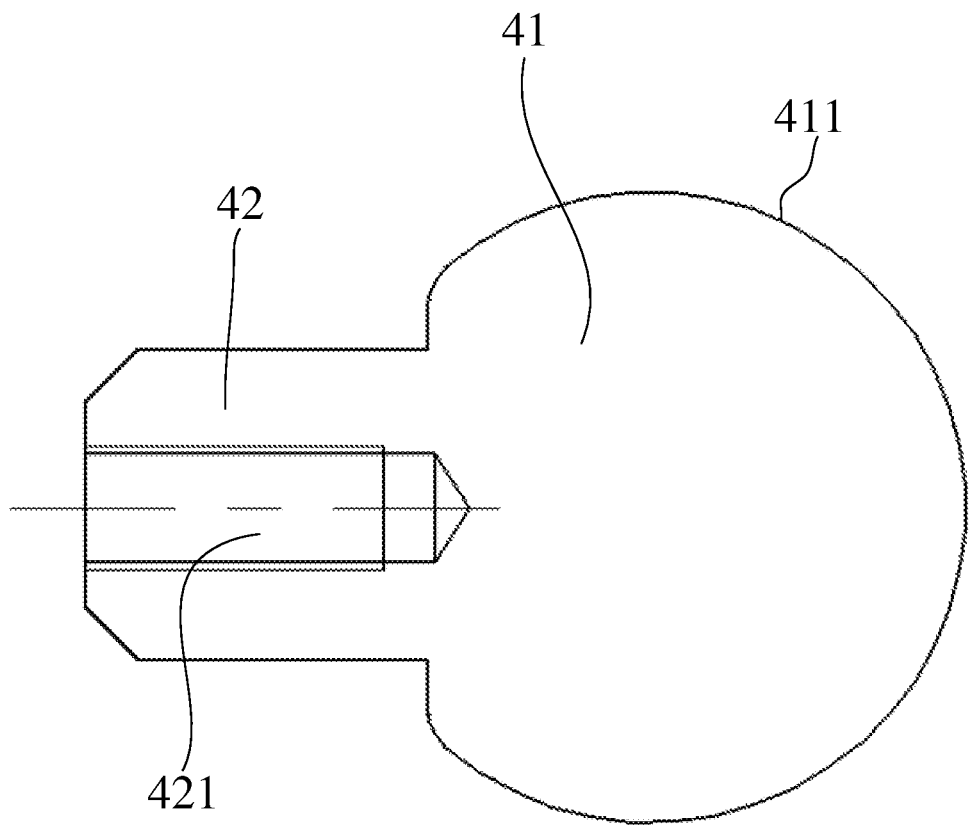
FIG. 15 is a front view of a shaft member included in a display device according to an embodiment of the present disclosure.

FIG. 15 is a front view of a shaft member included in a display device according to an embodiment of the present disclosure. Referring to FIG. 8 and FIG. 15, the shaft member 4 includes a pivot shaft 41 and a connecting arm 42. The pivot shaft 41 may include an arc-shaped surface 411. The pivot shaft 41 extends in a direction parallel to the display surface of the display device, and the base 7 has a receiving portion 71 for receiving the pivot shaft 41 so that the pivot shaft 41 may be fitted and mounted to the base 7. The term "fitted and mounted" herein means: the pivot shaft 41 may be fitted to the base 7, for example, the arc-shaped surface 411 of the pivot shaft 41 may be fitted to the receiving portion 71 of the base 7, and the pivot shaft 41 is mounted on the base 7. The connecting arm 42 protrudes toward the outer back plate 1 from the pivot shaft 41. The connecting arm 42 has a connecting arm hole 421 formed therein for receiving the connecting member 5. For example, the connecting member 5 may include screws. The connecting arm 42 is inserted into the shaft hole 109. That is, one end of the shaft structure 4 is connected to the base 7, and the other end is connected to the outer back plate 1.

Figure 14:
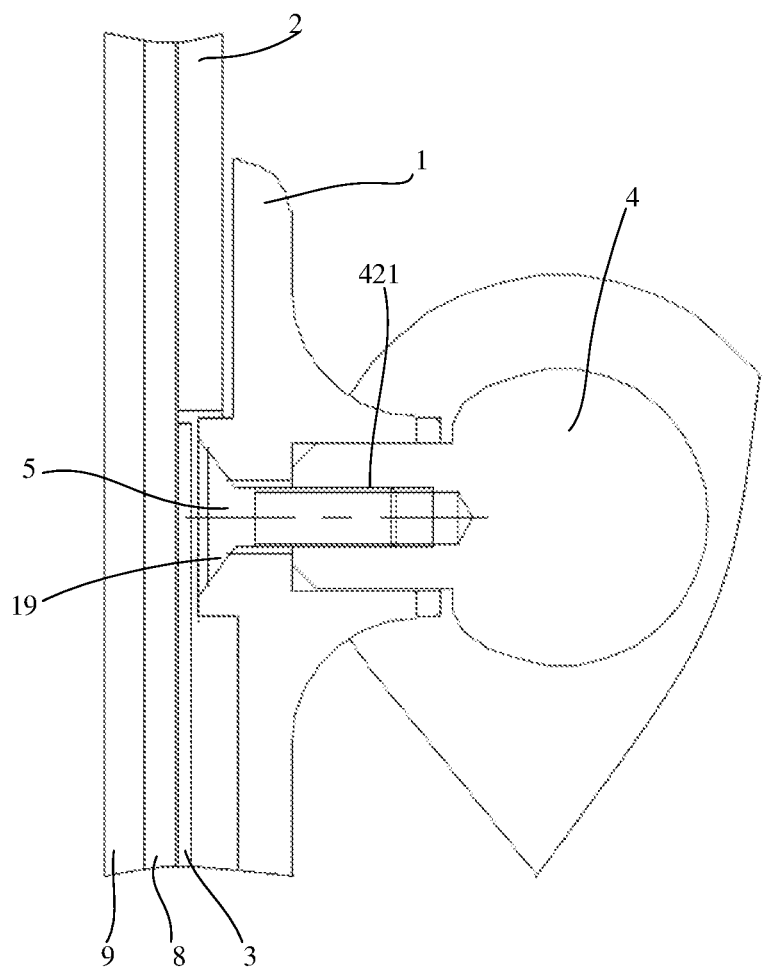
FIG. 14 is a partially enlarged view of a portion III in FIG. 9, clearly showing a connection relationship between a shaft member 4 and an outer back plate 1.

FIG. 14 is a partially enlarged view of a portion III in FIG. 9, clearly showing a connection relationship between the shaft member 4 and the outer back plate 1. Referring to FIGS. 7-9 and 14, the connecting hole 19 in the first protruding portion 15 of the outer back plate 1 may be aligned with the connection arm hole 421 in the connection arm 42 of the shaft member 4, i.e., the central axis of the connecting hole 19 is aligned or is completely coincided with the central axis of the connection arm hole 421 respectively. Thus, the connecting member 5 such as a screw can be inserted into the connecting hole 19 and the connecting arm hole 421 in order. Specifically, referring to FIG. 14, the head portion 51 of the connecting member 5, such as the screw, may be received in the first hole portion 191, and the rod 52 of the connecting member 5, such as the screw, may be received in the second hole portion 192 and the connecting arm hole 421. The outer back plate 1 and the shaft member 4 are connected and fixed together by the connecting piece.

Figure 11:
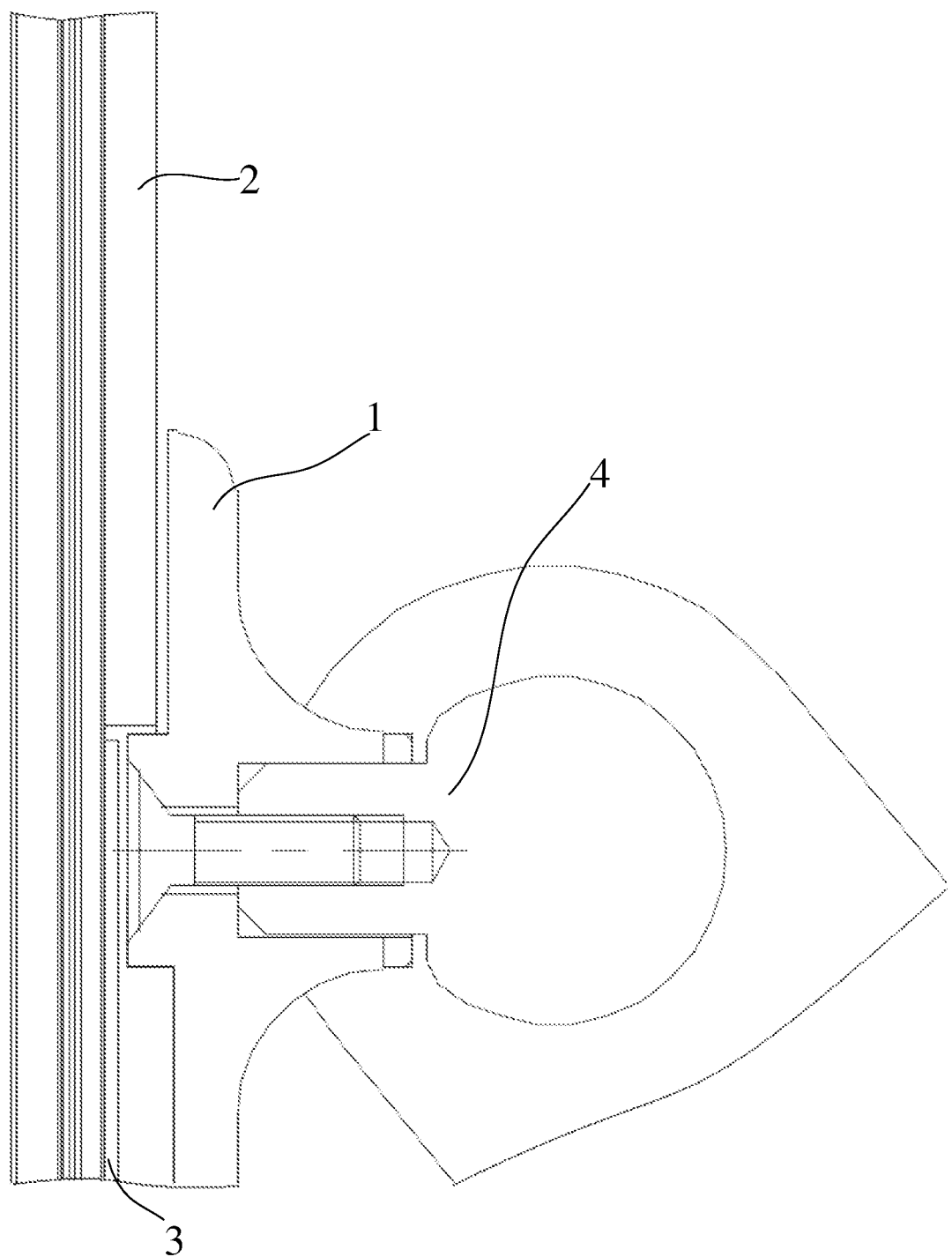
FIG. 11 is a partially enlarged view of a display device according to an embodiment of the present disclosure, which shows a relative position relationship between a first back plate, an outer back plate, a shaft member.
Figure 12:
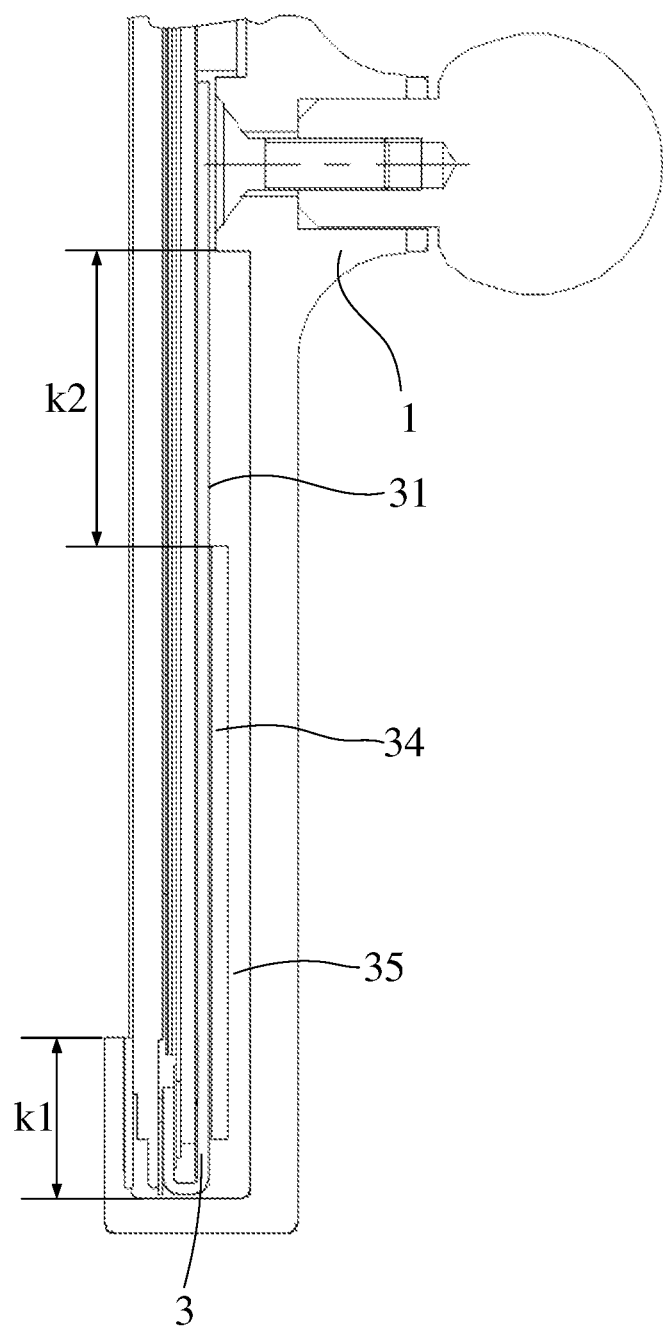
FIG. 12 is a partially enlarged view of a display device according to an embodiment of the present disclosure, which shows a relative position relationship between a second back plate, an outer back plate, and a shaft member.
Figure 13:
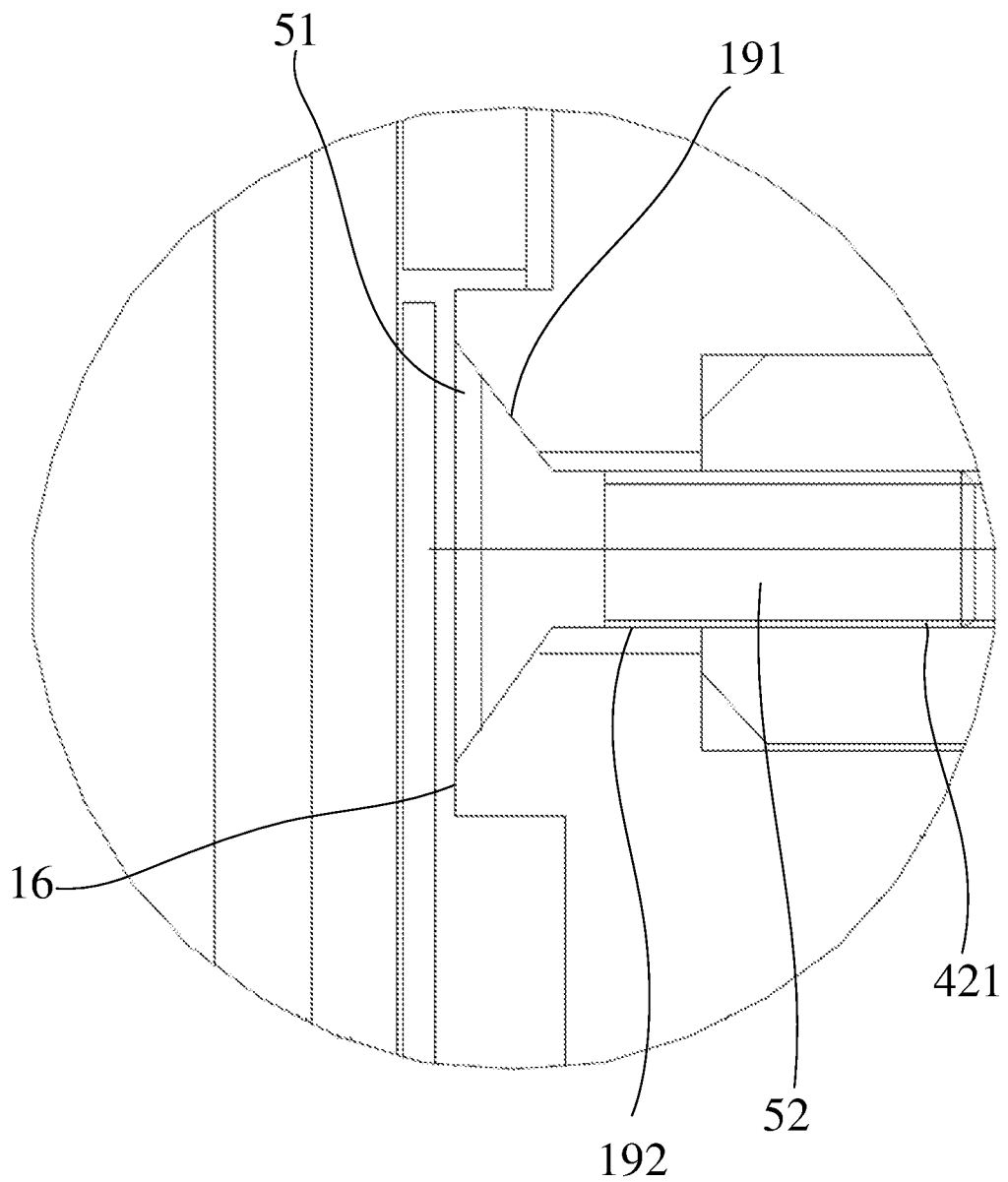
FIG. 13 is a partially enlarged view of a display device according to an embodiment of the present disclosure, which shows a connection relationship of components of an outer back plate near a first protruding portion.

FIG. 11 is a partially enlarged view of a display device according to an embodiment of the present disclosure, which shows a relative position relationship of the first back plate, the outer back plate, and the shaft member. FIG. 12 is a partially enlarged view of the display device according to an embodiment of the present disclosure, which shows a relative position relationship of the second back plate, the outer back plate, and the shaft member. FIG. 13 is a partially enlarged view of the display device according to an embodiment of the present disclosure, which shows a connection relationship of components of the outer back plate near the first protruding portion.

Referring to FIGS. 11-14, the backlight module 8 and the display panel 9 may be supported by the first back plate 2 and the second back plate 3 together.

In the embodiment of the present disclosure, the back plate assembly including the outer back plate 1 is fixedly connected to the shaft member 4 by the connecting member 5, and the shaft member 4 is fitted and mounted to the base 7. The back plate assembly can pivot with respect to the base 7 by the connection of the pivot shaft. Thereby, the display panel mounted on the back plate assembly may also pivot with respect to the base 7.

Referring to FIG. 11, the first back plate 2 is supported by the first supporting surface 11. Specifically, an orthographic projection of the first back plate back surface 21 of the first back plate 2 in a direction perpendicular to the display surface of the display device partially overlaps with an orthographic projection of the first supporting surface 11 in a direction perpendicular to the display surface of the display device. The first back plate back surface 21 and the first supporting surface 11 face each other, and a first glue portion 6 is provided between the first back plate back surface 21 and the first supporting surface 11.

Referring to FIG. 12, a circuit board 34 of an electronic device, such as a T-COM circuit board, is disposed on the second back plate back surface 31 of the second back plate 3. Specifically, the second back plate back surface 31 and the second supporting surface 12 face each other, and the thickness of the second back plate 3 is smaller than that of the first back plate 2, whereby an accommodating space 35 is formed between the second back plate back surface 31 and the second supporting surface 12, and the circuit board 34 can be located in the accommodating space 35. Through such an arrangement, it is possible to avoid additional increase in the thickness of the display device, which is beneficial to realizing an ultra-thin display device.

Refers to FIG. 12 again, a surface of the circuit board 34 facing the second supporting surface 12 is farther from the display surface of the display device than the first protruding surface 16. Through such an arrangement, it is possible to avoid additional increase in the thickness of the display device, which is beneficial to realizing an ultra-thin display device.

Optionally, the depth k1 of the receiving groove (i.e., a perpendicular distance between the groove bottom surface 101 and the free end of the second groove side surface 103) is smaller than a perpendicular distance k2 between a side surface of the circuit board 34 facing the first protrusion 15 and the second transition surface 18, so as to facilitate the assembly of the module including the circuit board 34 and the second back plate 3 and the like with the outer back plate 1. Specifically, when the module including the circuit board 34 and the second back plate 3 is assembled with the outer back plate 1, the outer back plate 1 may be placed at a suitable position along the up and down direction firstly, and the second back plate side surface 32 of the second back plate 3 is located above the free end of the second groove side surface 103 of the outer back plate 1. Then, the outer back plate 1 is pushed to move towards the second back plate 3, and the circuit board 34 on the second back panel 3 does not interfere with the first protruding portion 15 on the outer back plate 1 because of k2>k1. Finally, the outer back plate 1 is pushed to move upward so that a portion of the module (e.g., the second back plate 3, the circuit board 34 and the like) can be received in the receiving groove of the outer back plate, thereby achieving the assembly of the module with the outer back plate 1.

Alternatively, with reference to FIGS. 3 and 12, the outer back plate 1 may have separated structure. At this time, the assembly of the module including components such as the circuit board 34 and the second back plate 3 with the outer back plate 1 can be completed without k2>k1. Therefore, a perpendicular distance between the side surface of the circuit board 34 facing the first protruding portion 15 and the second transition surface 18 can be designed to be sufficiently small as long as the assembly clearance between the circuit board 34 and the first protruding portion 15 and their machining tolerances thereof can be ensured. In this case, the height of the outer back plate 1 can be reduced, which is advantageous for achieving miniaturization of the display device, so that the appearance of the display device is improved.

Referring to FIG. 13, the head portion 51 of the connecting member 5 such as a screw is received in the first hole portion 191, and the rod 52 of the connecting member 5 such as a screw is received in the second hole portion 192 and the connecting arm hole 421. The top surface of the head portion 51 of the connecting member 5 facing the second back plate 3 is substantially flush with the first protruding surface 16, i.e., the head portion 51 of the connecting member 5 is completely sunk into the first hole portion 191.

Referring to FIGS. 7-10, the pivot shaft 41 has a central axis AS (extending in a direction perpendicular to the paper in FIG. 10), which may be located at the center of the arc-shaped surface 411, for example. It should be noted that the central axis AS is an imaginary axis. The outer back plate 1 and the display panel thereon may be rotated downward by an angle $\alpha1$ about the central axis AS with respect to the base 7, and rotated upward by an angle $\alpha2$ about the central axis AS with respect to the base 7, whereby the rotation angle $\alpha$ of the outer back plate 1 and the display panel thereon with respect to the base 7 is $\alpha=\alpha1+\alpha2$.

Figure 10:
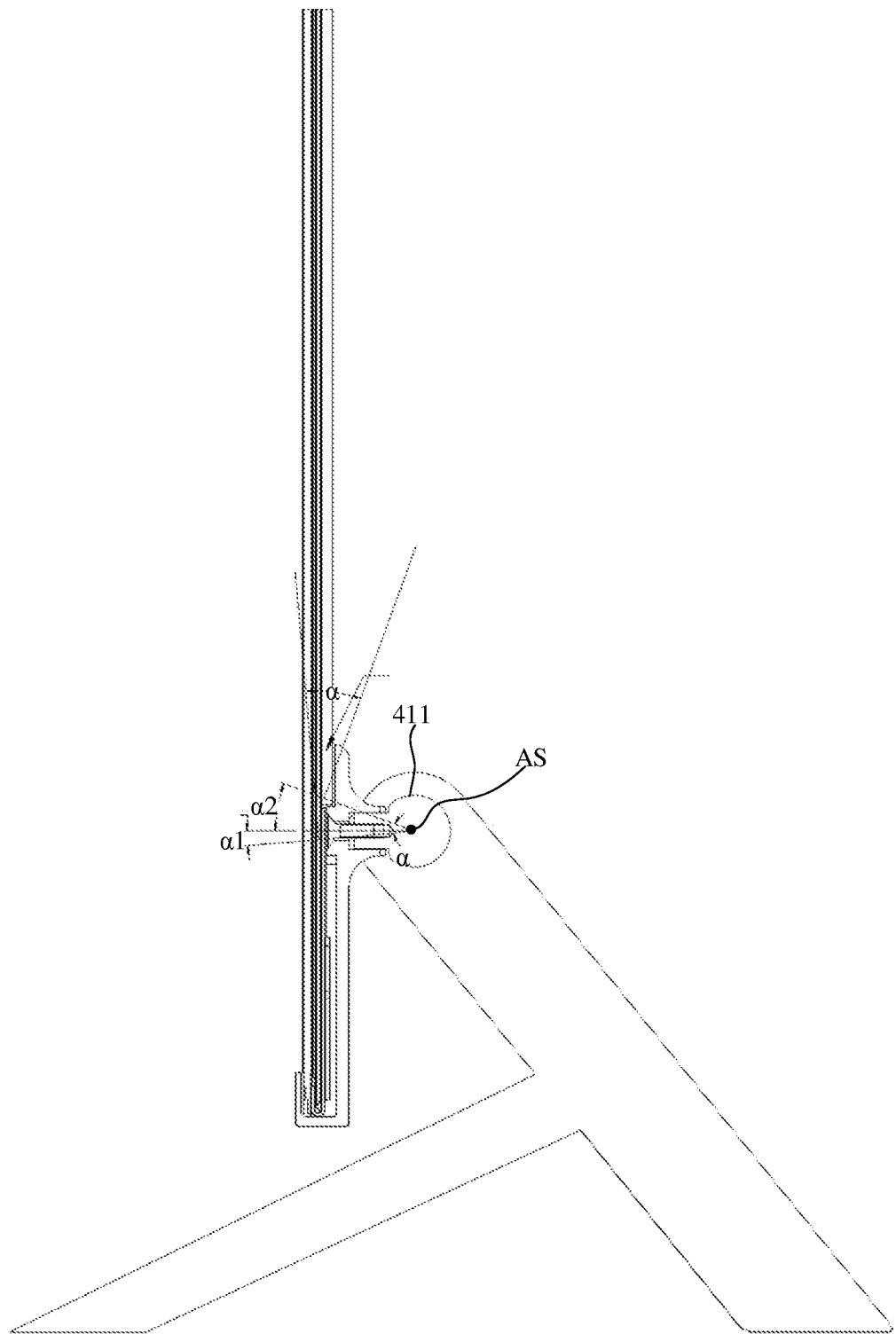
FIG. 10 is a front view of a display device according to an embodiment of the present disclosure, which schematically illustrates a rotational angle of a back plate assembly.

Referring to FIGS. 2, 10 and 14, a height h3 of the second protruding portion 105 of the outer back plate 1 protruding toward the back surface of the display device is related to the rotation angle of the outer back plate 1, and the height h3 is required to ensure that the outer back plate 1 does not interfere with the base 7 when the outer back plate 1 is rotated.

Figure 16:
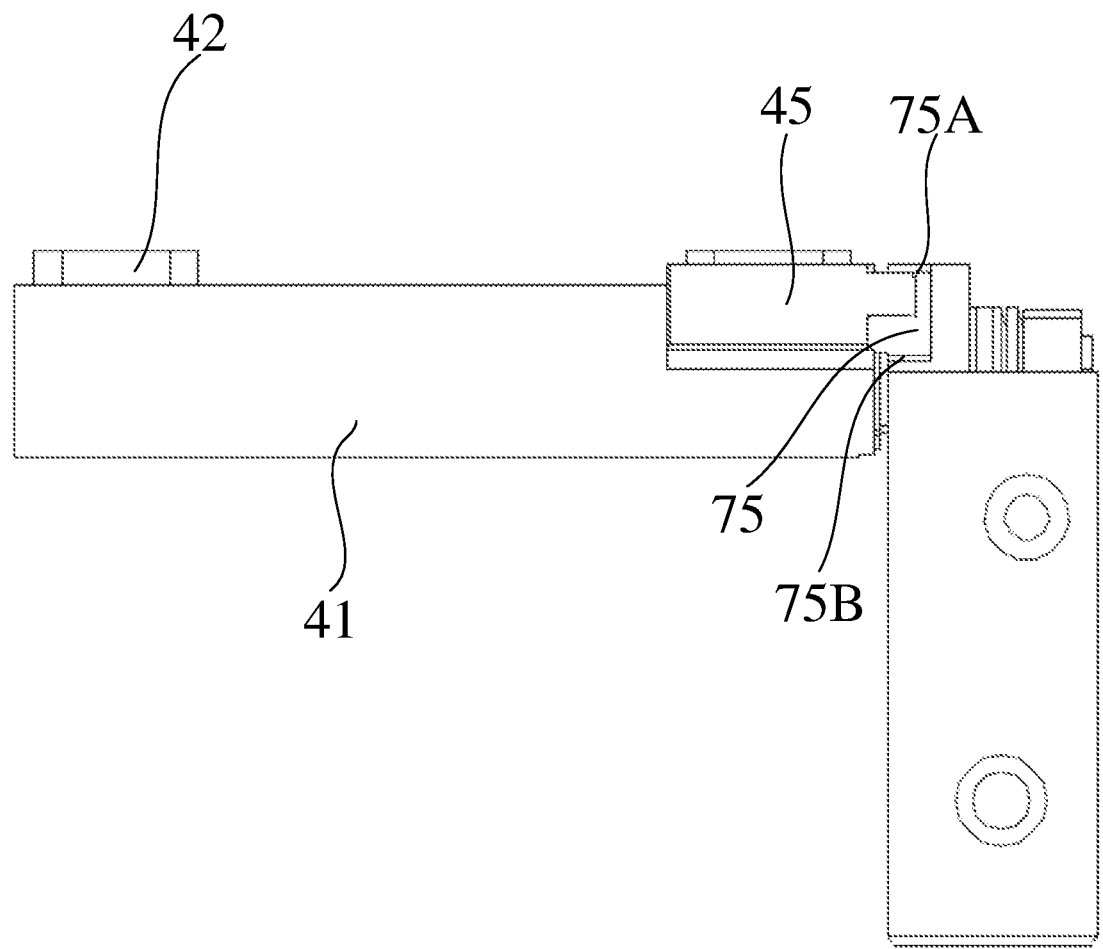
FIG. 16 is a schematic view schematically showing a connection structure of a shaft member and a base.

Referring to FIGS. 8 and 16, the shaft member 4 may further include a projecting structure 45. The base 7 may include a groove 75 which may be an arc-shaped groove with a certain angle. The projecting structure 45 is received in the groove 75 and can slide along the surface of the groove 75. By designing the angle of the arc-shaped groove, specifically, the groove 75 can have a first stopping position 75A (shown as an upper stopping position in FIG. 16) and a second stopping position 75B (shown as a lower stopping position in FIG. 16). The protruding structure 45 can be rotatable between the first stopping position 75A (shown as the upper stopping position in FIG. 16) and the second stopping position 75B (shown as the lower stopping position in FIG. 16). Therefore, the groove 75 can limit the rotation angle of the protruding structure 45, so as to limit the rotation angle of the outer back plate 1 and the display panel thereon with respect to the base 7.

For example, the display device in each of the various embodiments described above may be a display device such as notebook computer. Of course, embodiments of the present disclosure are not limited thereto, and for example, the display device may be any product or component having display function, such as smart phones, wearable smart watches, smart glasses, tablet computers, televisions, displays, digital photo frames, navigators, in-vehicle displays, electronic books and the like.

Although some embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A back plate assembly for a display device, comprising:
an outer back plate, wherein the outer back plate comprises:
a first supporting surface on a first side of the outer back plate;
a second supporting surface on the first side of the outer back plate;
a back surface on a second side of the outer back plate, the second side being opposite to the first side; and
a first connecting portion on the first side of the outer back plate, wherein the first connecting portion comprises a first protruding portion protruding in a direction away from the back surface of the outer back plate with respect to the first supporting surface and the second supporting surface to form a first protruding surface, and an orthographic projection of the first protruding surface in a direction perpendicular to the back surface of the outer back plate is located between an orthographic projection of the first supporting surface in the direction perpendicular to the back surface of the outer back plate and an orthographic projection of the second supporting surface in the direction perpendicular to the back surface of the outer back plate;
a first back plate, an orthographic projection of the first back plate in the direction perpendicular to the back surface of the outer back plate at least partially overlapping with an orthographic projection of the first supporting surface in the direction perpendicular to the back surface of the outer back plate; and
a second back plate, an orthographic projection of the second back plate in the direction perpendicular to the back surface of the outer back plate at least partially overlapping with an orthographic projection of the second supporting surface in the direction perpendicular to the back surface of the outer back plate;
wherein the outer back plate further comprises a receiving groove for receiving a part of the second back plate;
wherein a size of the first back plate in the direction perpendicular to the back surface of the outer back plate is greater than a size of the second back plate in the direction perpendicular to the back surface of the outer back plate; and
wherein the first back plate comprises a glass back plate and the second back plate comprises a metal back plate.

2. The back plate assembly of claim 1, wherein an orthographic projection of the second back plate in the direction perpendicular to the back surface of the outer back plate at least partially overlaps with an orthographic projection of the first protruding surface in the direction perpendicular to the back surface of the outer back plate.

3. The back plate assembly of claim 2, wherein the second back plate has a back surface facing the back surface of the outer back plate, the back surface of the second back plate and the first protruding surface face each other, and a gap is formed between the back surface of the second back plate and the first protruding surface.

4. The back plate assembly of claim 1, wherein the first back plate has a back surface facing the back surface of the outer back plate, the back surface of the first back plate and the first supporting surface face each other, and a first glue portion is disposed between the back surface of the first back plate and the first supporting surface.

5. The back plate assembly of claim 4, wherein the first back plate has a first back plate side surface facing the first protruding portion, and the outer back plate further comprises a first transition surface connecting the first supporting surface and the first protruding surface, and the first transition surface supports the first back plate side surface.

6. A display device, comprising:
the back plate assembly of claim 1;
a shaft member;
a base; and
a connecting member,
wherein a first end of the shaft member is connected with the outer back plate of the back plate assembly, and a second end of the shaft member is connected with the base; and the connecting member is used to connect the outer back plate of the back plate assembly and the shaft member.

7. The display device of claim 6, wherein the shaft member comprises:
a pivot shaft fitted and mounted on the base; and
a connecting arm protruding toward the outer back plate from the pivot shaft, the connecting arm comprising a connecting arm hole for receiving the connecting member.

8. The display device of claim 7, wherein the outer back plate of the back plate assembly comprises a second connecting portion which comprises a second protruding portion and a shaft hole in the second protruding portion, the shaft hole receiving the connecting arm, wherein the first connecting portion further comprises a connecting hole in the first protruding portion, and the connecting hole communicates with the connecting arm hole and a central axis of the connecting hole coincides with a central axis of the connecting arm hole, such that the connecting member is suitable to be inserted into the connecting hole and the connecting arm hole which communicate with each other.

9. The display device of claim 6, further comprising a circuit board on a second back plate back surface of the second back plate facing a back surface of the outer back plate,
wherein the first back plate has a first back plate side surface facing the first protruding portion, and the outer back plate further comprises a first transition surface connecting the first supporting surface and the first protruding surface, and the first transition surface supports the first back plate side surface; and
wherein the outer back plate further comprises a second transition surface connecting the second supporting surface and the first protruding surface, and a side of the circuit board facing the first protruding portion is spaced apart from the second transition surface.

10. The display device of claim 9, wherein the outer back plate further comprises a receiving groove, the receiving groove comprising:
a first groove side surface;
a second groove side surface parallel to the first groove side surface; and
a groove bottom surface connecting the first groove side surface and the second groove side surface,
wherein the second groove side surface has a connecting end connected to the groove bottom surface and a free end distal to the groove bottom surface, and
wherein a perpendicular distance between a side surface of the circuit board facing the first protrusion portion and the second transition surface is greater than a perpendicular distance between the groove bottom surface and the free end of the second groove side surface.

11. The back plate assembly of claim 1, wherein the outer back plate further comprises a second connecting portion, wherein the second connecting portion is on the second side of the outer back plate and comprises a second protruding portion, and an orthographic projection of the second protruding portion in the direction perpendicular to the back surface of the outer back plate at least partially overlaps an orthographic projection of the first protruding portion in the direction perpendicular to the back surface of the outer back plate.

12. The back plate assembly of claim 11, wherein the first connecting portion further comprises a connecting hole in the first protruding portion, and the second connecting portion further comprises a shaft hole in the second protruding portion, and the connecting hole is in communication with the shaft hole.

13. The back plate assembly of claim 12, wherein the connecting hole has a first hole portion and a second hole portion, the first hole portion is closer to the first protruding surface than the second hole portion, the first hole portion communicates with the second hole portion, and a diameter of the first hole portion is equal to or larger than a diameter of the second hole portion.

14. The back plate assembly of claim 1, wherein the outer back plate further comprises a receiving groove, wherein the receiving groove comprises:
a first groove side surface;
a second groove side surface parallel to the first groove side surface; and
a groove bottom surface connecting the first groove side surface and the second groove side surface,
wherein the first groove side surface is coplanar with the second supporting surface, and the second groove side surface has a connecting end connected to the groove bottom surface and a free end distal to the groove bottom surface.

15. The back plate assembly of claim 1, wherein the outer back plate further comprises:
a first transition surface connecting the first supporting surface and the first protruding surface, wherein the first transition surface is perpendicular to the first supporting surface and the first protruding surface; and/or
a second transition surface connecting the second supporting surface and the first protruding surface, wherein the second transition surface is perpendicular to the second supporting surface and the first protruding surface.

16. The back plate assembly of claim 1, wherein the second supporting surface is closer to the back surface in the direction perpendicular to the back surface of the outer back plate than the first supporting surface.

* * * * *